(12) United States Patent
Iwamoto

(10) Patent No.: US 7,738,021 B2
(45) Date of Patent: Jun. 15, 2010

(54) IMAGING DEVICE

(75) Inventor: Shinji Iwamoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 593 days.

(21) Appl. No.: 11/265,708

(22) Filed: Nov. 2, 2005

(65) Prior Publication Data

US 2006/0103750 A1 May 18, 2006

(30) Foreign Application Priority Data

Nov. 15, 2004 (JP) ............................ P2004-330807

(51) Int. Cl.
*H04N 5/335* (2006.01)
(52) U.S. Cl. .......................................... 348/311; 257/4
(58) Field of Classification Search ................ 348/248, 348/249, 250, 294, 311, 312, 314, 315, 317; 257/4, 230, 445
See application file for complete search history.

(56) References Cited

U.S. PATENT DOCUMENTS

| | | | | | |
|---|---|---|---|---|---|
| 4,847,692 | A | * | 7/1989 | Tabei | .......................... 348/315 |
| 5,250,825 | A | * | 10/1993 | Negishi et al. | ............... 257/232 |
| 5,506,429 | A | * | 4/1996 | Tanaka et al. | ................ 257/233 |
| 5,661,317 | A | * | 8/1997 | Jeong | .......................... 257/225 |
| 5,731,601 | A | * | 3/1998 | Shioyama et al. | ........... 257/233 |
| 5,834,801 | A | * | 11/1998 | Jeong | ........................... 257/232 |
| 5,895,944 | A | * | 4/1999 | Yamada | ........................ 257/233 |
| 5,917,208 | A | * | 6/1999 | Hatano | ......................... 257/249 |
| 6,097,433 | A | * | 8/2000 | Kawai et al. | ................. 348/315 |
| 6,188,119 | B1 | * | 2/2001 | Ogawa et al. | ................ 257/435 |
| 6,606,124 | B1 | * | 8/2003 | Hatano et al. | ................ 348/311 |
| 6,784,469 | B1 | * | 8/2004 | Yamane et al. | .............. 257/222 |
| 7,230,288 | B2 | * | 6/2007 | Yamane et al. | .............. 257/222 |
| 2002/0024066 | A1 | * | 2/2002 | Ide | .............................. 257/214 |
| 2005/0247933 | A1 | * | 11/2005 | Kanbe | .......................... 257/59 |

FOREIGN PATENT DOCUMENTS

JP 2000-232217 * 8/2000
JP 2001-060681 3/2001

* cited by examiner

*Primary Examiner*—Lin Ye
*Assistant Examiner*—Chriss S Yoder, III
(74) *Attorney, Agent, or Firm*—Robert J. Depke; Rockey, Depke & Lyons, LLC

(57) ABSTRACT

A imaging device includes an image pickup region composed of a plurality of light-receiving portions (2) and vertical transfer registers (3) including a plurality of transfer electrodes containing a transfer electrode (8) serving as a read electrode as well and other transfer electrode (7), the vertical transfer registers (3) being arrayed at every column of light-receiving portions (2). Each transfer electrode (8) serving as the read electrode as well disposed within the vertical transfer register (3) is formed such that it may be separated from the transfer electrode (8) serving as read electrode as well and other transfer electrode (7) which are adjoining each other in the horizontal direction. In this imaging device including a plurality of light-receiving portions (2) regularly arrayed, it is possible to prevent color mixture from occurring between the light-receiving portions (pixels) (2) which are adjoining each other in the vertical direction.

1 Claim, 8 Drawing Sheets

IMAGING DEVICE

CROSS REFERENCES TO RELATED APPLICATIONS

The present invention contains subject matter related to Japanese Patent Application JP 2004-330807 filed in the Japanese Patent Office on Nov. 15, 2004, the entire contents of which being incorporated herein by reference.

BACKGROUND OF THE INVENTION

1. Field of the Invention

The present invention relates generally to imaging devices, and particularly to a imaging device having a transfer electrode pattern.

2. Description of the Related Art

Various kinds of CCD (charge-coupled device) imaging devices are proposed so far, in which a charge transfer portion is formed on a semiconductor substrate, transfer electrodes are disposed on the upper layer of the charge transfer portion through an insulating layer, signal electric charges being transferred by the charge transfer portion with application of drive pulses to the transfer electrodes. As the arrangement pattern of the transfer electrodes on the CCD imaging device, there are known an arrangement pattern having a multilayer structure in which the transfer electrodes are located such that the adjacent transfer electrodes are partly overlapping with each other and an arrangement pattern having a single layer structure in which the transfer electrodes are located such that the adjacent transfer electrodes are not overlapping with each other.

FIG. 1 of the accompanying drawings, for example, is a plan view showing a main portion of an image pickup region of a CCD imaging device including transfer electrodes with single layer structures and an electrode pattern thereof. FIG. 2 is a cross-sectional view taken along the line A-A of the CCD imaging device shown in FIG. 1. The illustrated examples show transfer electrodes for use with a vertical transfer register by which signal electric charges, received at light-receiving portions of the CCD imaging device, are transferred in the vertical direction.

As shown in FIG. 2, a light-receiving portion and a charge transfer portion (not shown) are provided within a silicon substrate 101, and transfer electrodes 107 and 108 made of a suitable material such as polycrystalline silicon are provided on the upper layer of the silicon substrate 110 through an insulating film 111 made of a suitable material such as silicon oxide. The transfer electrode 108 may serve as a read electrode to which a read voltage to read signal electric charges from the light-receiving portion to the charge transfer portion, that is, a gate electrode of a read gate portion as well.

As shown in FIG. 1, the transfer electrodes 107 and 108 are formed with patterns so as to avoid light-receiving portions 102 of the CCD imaging device. The transfer electrode portions 107 and 108 are located close to each other in the portion in which they are located along charge transfer portions 103. Also, the transfer electrodes 107 and 108 are located between the vertically-adjacent light-receiving portions (pixels) 102 and 102 so as to connect the adjoining vertical transfer registers 103 and 103.

On the other hand, as a method of transferring signal electric charges read out to the vertical transfer registers in the CCD imaging device, there is known a technology for forming a shunt wiring structure by which a shunt wiring made of a suitable thin sheet material having a small sheet resistance, such as aluminum (Al) and tungsten (W), is joined to the transfer electrode.

Cited Patent Reference 1: Official Gazette of Japanese laid-open patent application No. 2002-158925

Cited Patent Reference 2: Official Gazette of Japanese laid-open patent application No. 2003-7997

In the CCD imaging device shown in FIG. 1, when signal electric charges generated by light incident on the light-receiving portion 102 are read out to the vertical transfer register 103, a read voltage (a high-level pulse of three-value pulses) V1 is applied to the transfer electrode 108 that serves as the read electrode as well. Then, with application of this read voltage V1, the signal electric charges are read out from the light-receiving portion 102 to the vertical transfer register 103.

However, as mentioned above, since the transfer electrode 108, which serves as the read electrode as well, is extended between the light-receiving portions (pixels) 102 adjoining in the vertical direction, the read voltage V1 is also applied to this extended portion of the transfer electrode 108. Although a channel stop layer for separating the pixels is formed between the light-receiving portions (pixels) 102 and 102 which are adjoining each other in the vertical direction, a potential barrier of the channel stop layer formed beneath the transfer electrode 108 is broken (modulated) with application of this read voltage V1 so that signal electric charges are also transferred from the light-receiving portions 102 and 102 to the vertical direction. As a result, a problem arises, in which color mixture occurs in the vertical direction between the light-receiving portions 102 and 102 which are adjoining each other in the vertical direction. Specifically, a phenomenon occurs, in which a part of signal electric charges, which should be read out to the vertical transfer register 103, is leaked to other light-receiving portions (pixels) 102 and 102 which are adjoining each other in the vertical direction. In particular, when a gap between the light-receiving portions (pixels) 102 and 102 which are adjoining each other in the vertical direction is reduced or a width of the channel stop region is reduced in order to microminiaturize the pixel in size, a problem of color mixture tends to occur more easily.

In order to prevent the above-mentioned color mixture, the potential barrier at the channel stop layer can be strengthened by increasing an impurity concentration of the channel stop layer formed between the pixels adjoining in the vertical direction or by increasing the depth of the channel stop layer with implantation of ions in a multiple stage fashion. However, there arises another problem, in which the region of the light-receiving portion 102 is reduced when impurities are diffused in the lateral direction of the channel stop layer by an annealing process for activating the ion-implanted channel stop layer and in which the number of manufacturing processes is increased with addition of the ion implantation process.

SUMMARY OF THE INVENTION

In view of the aforesaid aspects, the present invention intends to provide a imaging device in which color mixture can be prevented from being generated between the pixels adjoining in the vertical direction due to a read voltage.

According to an aspect of the present invention, there is provided a imaging device which is comprised of an image pickup region composed of a plurality of light-receiving portions and vertical transfer registers including a plurality of transfer electrodes including a transfer electrode serving as a read electrode as well and other transfer electrode, the vertical transfer registers being arrayed at every column of light-receiving portions, wherein each transfer electrode serving as the read electrode as well disposed within a vertical transfer register is separated from a transfer electrode serving as a read electrode as well and other transfer electrode which are adjoining each other in the horizontal direction.

Preferably, in the above-mentioned imaging device, the transfer electrode serving as the read electrode as well is connected to a shunt wiring located between the light-receiving portions which are adjoining each other in the vertical direction.

Preferably, in the above-mentioned imaging device, the shunt wiring is formed on the other transfer electrode.

Preferably, in the above-mentioned imaging device, the shunt wiring has a vertical width narrower than a vertical width of the other transfer electrode having the shunt wiring provided thereon.

Preferably, in the above-mentioned imaging device, the transfer electrode serving as the read electrode as well and other transfer electrode are formed by a single layer structure.

More preferably, in the above-mentioned imaging device, the vertical width of the transfer electrode serving as the read electrode as well within the vertical transfer register and the vertical width of the other transfer electrode are formed to be the same width.

DESCRIPTION OF THE PREFERRED EMBODIMENTS

The present invention will be described below in detail with reference to the drawings.

FIGS. 3 to 10 are diagrams showing imaging devices according to the embodiments of the present invention, illustrating the cases in which the present invention is applied to an interline transfer (IT) type CCD imaging device.

Figure 3:
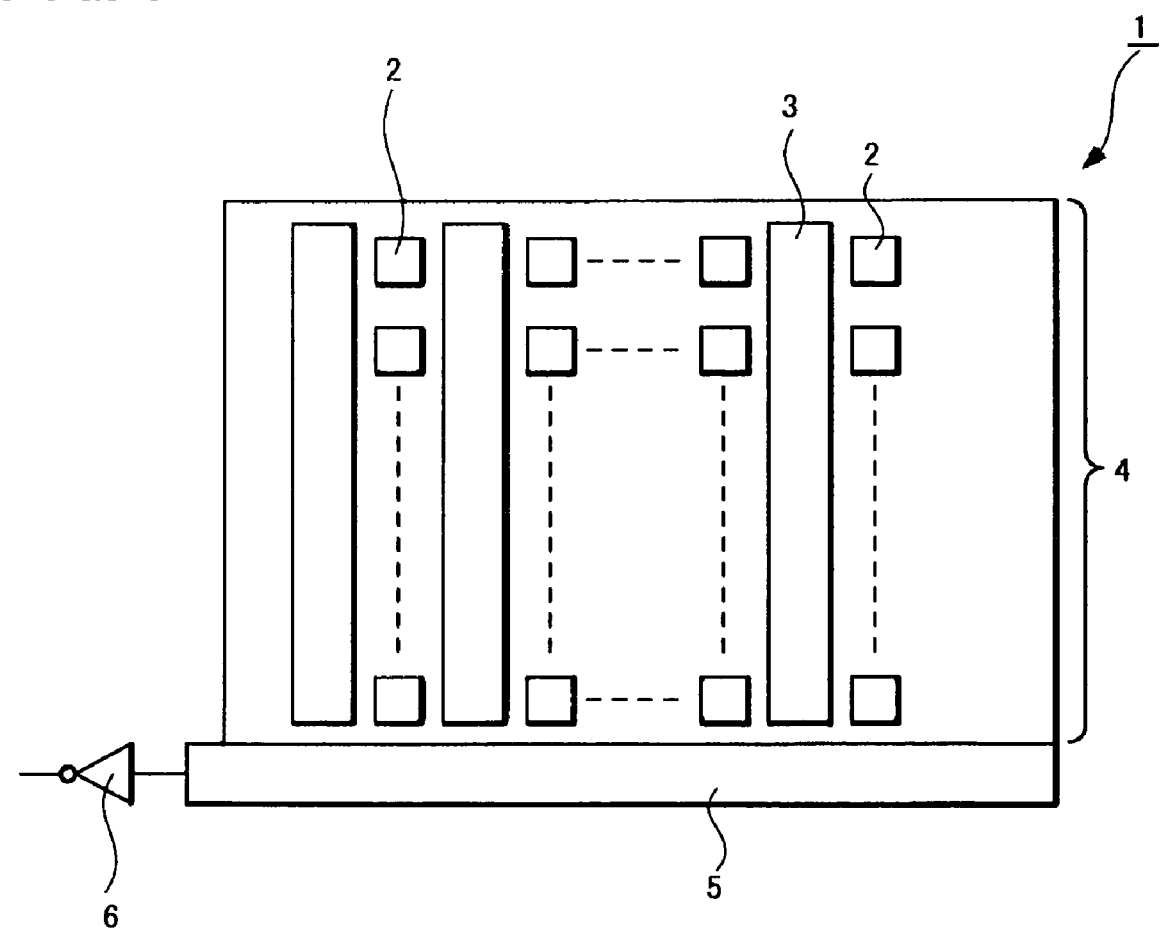
FIG. 3 is a schematic diagram showing an arrangement of a imaging device according to the present invention.

FIG. 3 is a schematic diagram showing an arrangement of a CCD imaging device 1 according to a first embodiment of the present invention.

As shown in FIG. 3, this CCD imaging device 1 is composed of an image pickup region 4 consisting of a plurality of light-receiving portions 2 arrayed in a matrix fashion to perform photoelectric conversion and a plurality of vertical transfer registers 3 having CCD structures corresponding to every column of the light-receiving portion 2, a horizontal transfer register 5 having a CCD structure located at one end of the image pickup region 4 to which signal electric charges are transferred from the vertical transfer registers 3 and an output unit 6 connected to the final stage of the horizontal transfer register 5.

The respective light-receiving portions 2 are divided by a channel stop layer serving as a pixel separating region as well as will be described later on. The arrangement of a plurality of light-receiving portions 2 may not be limited, in particular, to the above-mentioned matrix-like arrangement and any arrangement of the light-receiving portions 2 may be selected freely so long as they are arrayed with regularity.

In this CCD imaging device 1, after signal electric charges generated by light incident on the light-receiving portion 2 were read out to the vertical transfer register 3, they are transferred to the horizontal transfer register 5 in response to four-phase drive pulses $\phi 1$ to $\phi 4$, which will be described later on. Further, those signal electric charges are transferred within the horizontal transfer register 5 in response to two-phase drive pulses, for example, and they are outputted from the output portion 6 as an output signal.

Figure 4:
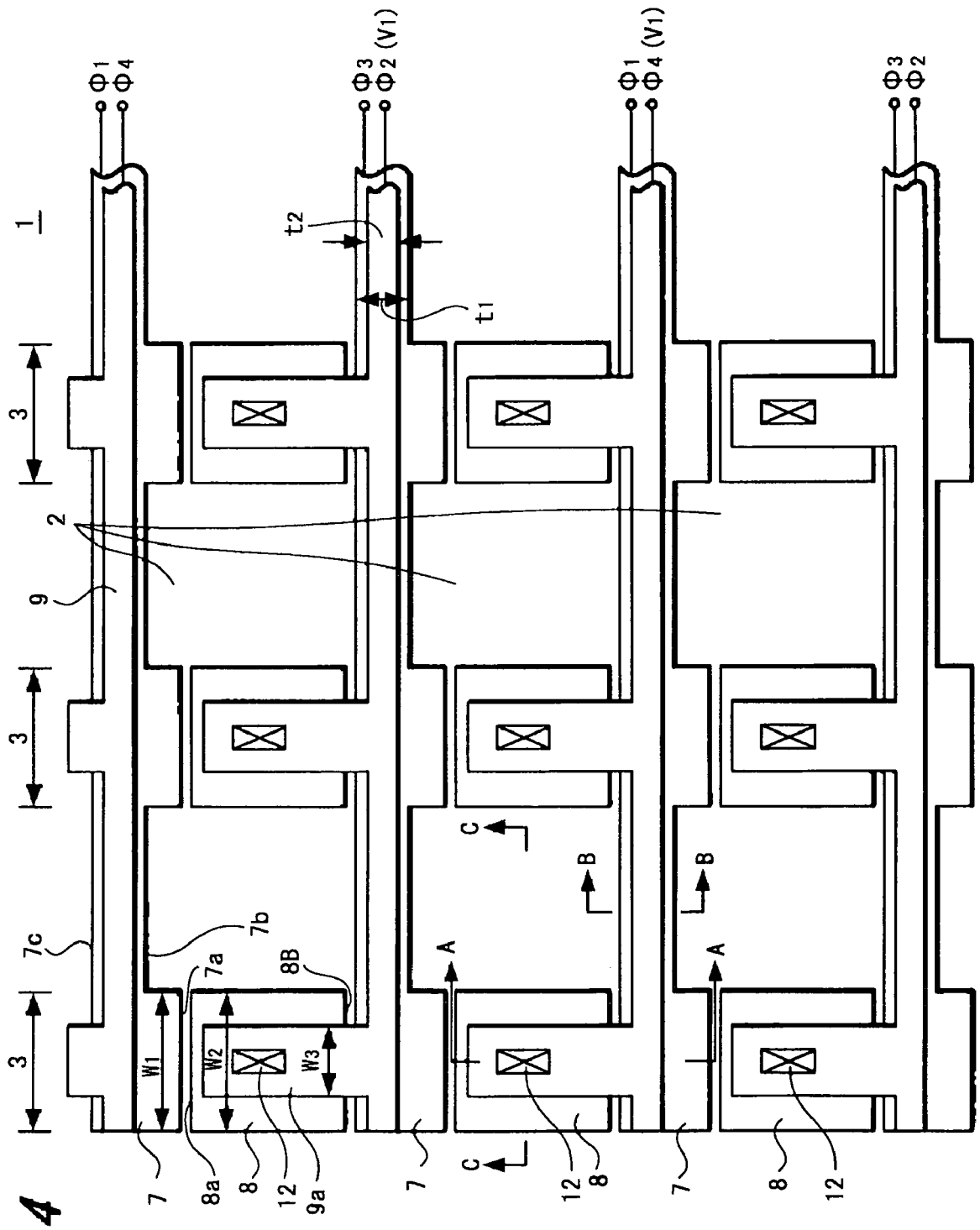
FIG. 4 is a plan view showing a main portion of an image pickup region of a imaging device having a transfer electrode according to a first embodiment of the present invention and an electrode pattern thereof.

FIG. 4 is a plan view showing a main portion of an image pickup region of a imaging device including a transfer electrode according to this embodiment and an electrode pattern thereof. More specifically, FIG. 4 is a plan view showing the transfer electrode pattern of the vertical transfer register 3 by which signal electric charges received at the light-receiving portion 2 are transferred to the vertical direction.

Figure 5:
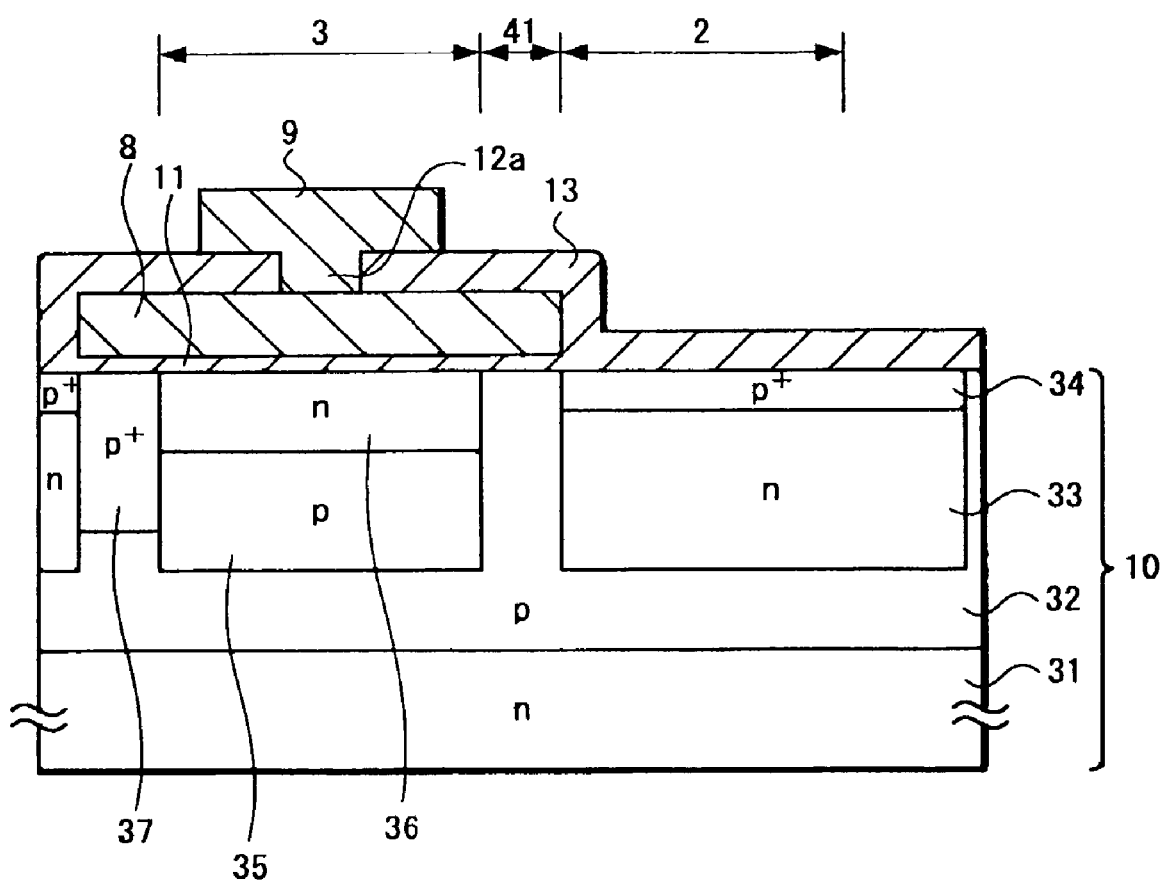
FIG. 5 is an enlarged cross-sectional view taken along the line C-C of the imaging device shown in FIG. 4.

First, a cross-sectional structure of a unit pixel of this imaging device will be described with reference to FIG. 5. FIG. 5 is an enlarged cross-sectional view taken along the line C-C of the imaging device shown in FIG. 4.

According to this embodiment, as shown in FIG. 5, a second conductivity type, for example, p type first semiconductor well region 32 is formed on a first conductivity type, for example, n type silicon substrate 31. A photodiode serving as the light-receiving portion 2 in which an n type charge accumulation region 33 and a $p^+$ accumulation layer 34 to suppress a dark current formed on the surface of the n type charge accumulation region 33 is formed on the first p type semiconductor well region 32 at its region in which the light-receiving portion 2 is formed. This light-receiving portion 2 is referred to as an "HAD (hole accumulation diode) sensor". The first p type semiconductor well region 32 becomes an overflow control gate region. On the other hand, a second p type semiconductor well region 35 is formed on the first p type semiconductor well region 32 at its portion in which the vertical transfer register 3 is formed. An n type transfer channel region (hereinafter referred to as a "charge transfer portion") 36 is formed on the second p type semiconductor well region 35. Transfer electrodes 7, 8 (only transfer electrode 8 is shown in FIG. 5) made of polycrystalline silicon, for example, are formed on an n type transfer channel region 36 of the silicon substrate 10 containing the n type semiconductor substrate 31, the first p type semiconductor well region 32 and other regions through a gate insulating film 11 made of a suitable material such as silicon oxide. The charge transfer portion 36, the gate insulating film 11 and the transfer electrodes 7 and 8 constitute the vertical transfer register 3.

The transfer electrode 8 is formed such that it may be extended over a read gate portion 41 and a p+ channel stop layer 37 which becomes a pixel separating region for dividing the unit pixel. Specifically, this transfer electrode 8 may serve as a read electrode (gate electrode) of the read gate portion 41 as well. Further, a shunt wiring 9 is connected to this transfer electrode 8 through an opening of an insulating film 13 as will be described later on. Although not shown, a light-shielding film is formed on the whole surface of a tab containing the vertical transfer register 3 except the light-receiving portion 2 through an interlayer insulator. Further, a color filter is formed through a planarized film and an on-chip lens corresponding to each light-receiving portion 2 is formed on the color filter.

Then, as shown in FIG. 4, the transfer electrode 7 and the transfer electrode 8 serving as the read electrode as well are located close to each other in the vertical transfer register 3 at its portion in which they are extended along the charge transfer portion. The transfer electrodes 7 and 8 formed of the polycrystalline silicon layers are alternately and repeatedly arrayed in the charge transfer direction, that is, the vertical direction. The transfer electrode 7 is formed so as to have an edge portion 7a provided close to the transfer electrode 8 serving as the adjacent read electrode as well extending along the charge transfer portion within the vertical transfer register 3, an edge portion 7b provided so as to avoid the light-receiving portion 2 and an edge portion 7c provided on the opposite side of these edge portions 7a and 7b. Specifically, the transfer electrode 7 is extended between the light-receiving portions (pixels) 2 and 2 which are adjoining each other in the vertical direction and it is shaped like the teeth of a comb so that the corresponding transfer electrodes 7 located within each vertical transfer register 3 may be coupled together as one body.

As shown in FIG. 4, the transfer electrode 8 serving as the read electrode as well is formed so as to be located within the vertical transfer register 3 and it may include edge portions 8a and 8b provided so as to become close to the adjacent transfer electrode 7 along the charge transfer direction. The edge portion 8a is formed so as to become close to the edge portion 7a of the transfer electrode 7 and the edge portion 8b is formed so as to become close to the edge portion 7c of the transfer electrode 7. As shown in FIG. 4, the edge portions 8a, 7a and the edge portions 8b, 7c are formed so as to have predetermined gaps therebetween. More specifically, the transfer electrode 8 serving as the read electrode as well may be formed so as to be separated from any electrodes, that is, it may be shaped like a so-called floating waterweeds-like electrode.

The transfer electrode 7 within the vertical transfer register 3 has an extended portion opposing to the transfer electrode 8. A horizontal width W1 of this extended portion is formed so as to become the same as a horizontal width W2 of the opposing transfer electrode 8. The horizontal widths W1 and W2 of the transfer electrodes 7 and 8 existing within the same vertical transfer register 3 are formed so as to become the same. It is possible to efficiently transfer signal electric charges within the vertical transfer register 3 by making the horizontal widths W1 and W2 of the transfer electrodes 7 and 8 located within the same vertical transfer register 3 become equal to each other.

Also, the shapes of the transfer electrodes 8 within the same vertical transfer register 3 are selected so as to become identical to those of other transfer electrodes 8. As described above, signal electric charges can be transferred efficiently within the vertical transfer register 3 by making the shapes of the transfer electrodes 8 within the vertical transfer register 3 become equal to each other.

In the case of this embodiment, the adjacent vertical transfer registers are coupled together by only the transfer electrode 7 so that only the transfer electrode 7, which does not serve as the read electrode as well, is located between the light-receiving portions 2 and 2 which are adjoining each other in the vertical direction. Also, as mentioned hereinbefore, the transfer electrode 7, which does not serve as the read electrode as well, is commonly used in every column of vertical transfer registers 3.

The shunt wiring 9 made of a suitable thin sheet material with small sheet resistance such as polycrystalline silicon is formed over the horizontal direction of the transfer electrode 7 provided between the light-receiving portions 2 and 2 which are adjoining in the vertical direction. Then, as shown in FIG. 4, a part of the shunt wiring 9 is extended in the vertical direction, whereby an extended portion 9a is formed so as to be extended over each transfer electrode 8 serving as the read electrode as well. A contact portion 12 is formed on the extended portion 9a of the shunt wiring 9. In this contact portion 12, the shunt wiring 9 is connected to the transfer electrode 8 through a contact hole 13a formed on the interlayer insulator 13 (see FIG. 6).

Further, as shown in FIG. 4, a vertical width t2 of the shunt wiring 9 is made narrower than a vertical width t1 of the transfer electrode 7. Also, a horizontal width w3 of the extended portion 9a of the shunt wiring 9 extended over the transfer electrode 8 is made narrower than a horizontal width w2 of the transfer electrode 8 (see FIG. 4).

As signal electric charges are read from the light-receiving portion 2 to the vertical transfer register 3, the signal electric charges read out to the vertical transfer register 3 are transferred within the vertical transfer register 3 in response to the four-phase drive pulses φ1 to φ4.

Figure 1:
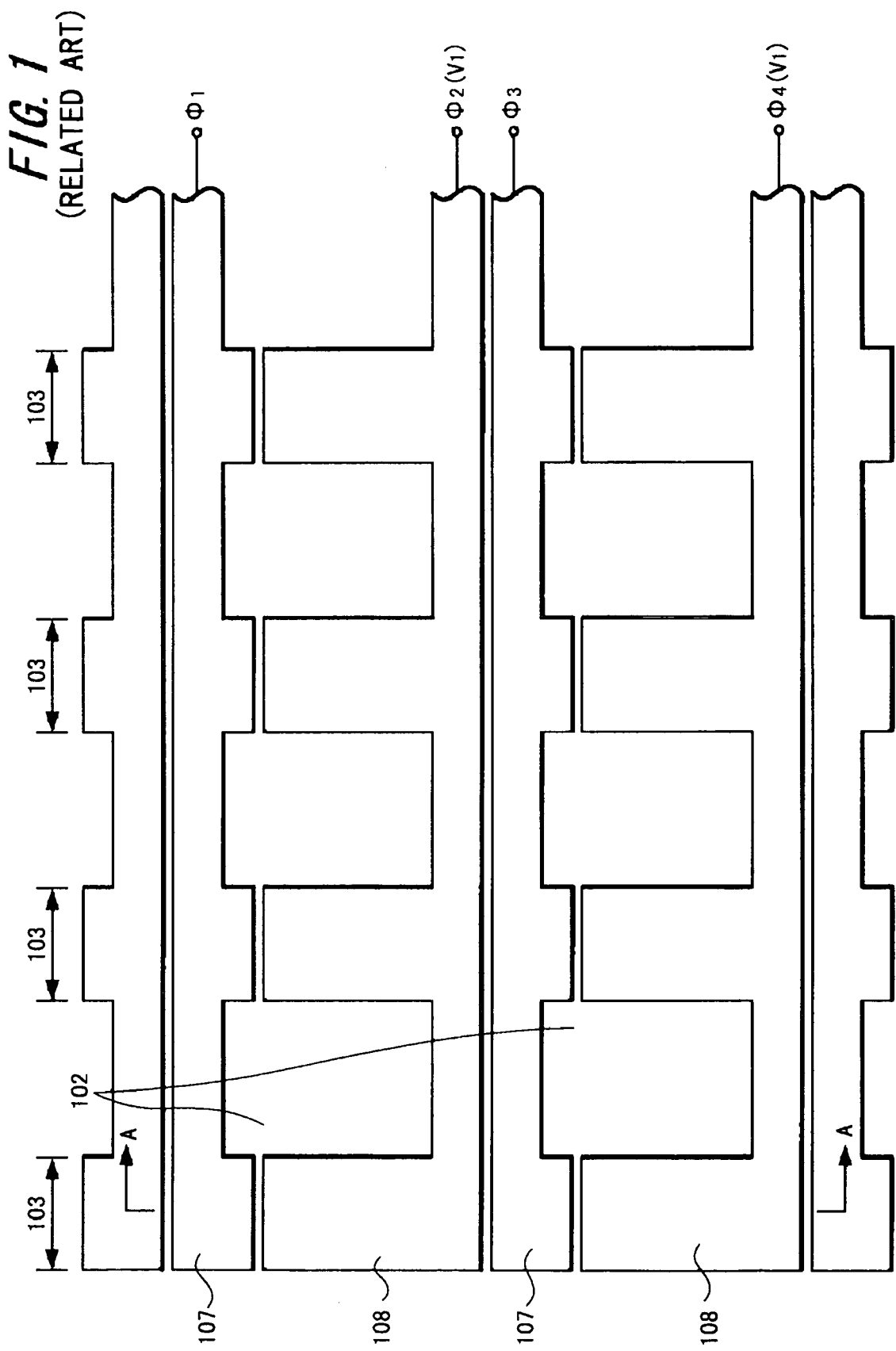
FIG. 1 is a plan view showing a main portion of an image pickup region of a imaging device having a transfer electrode according to the related art and an electrode pattern thereof.
Figure 2:
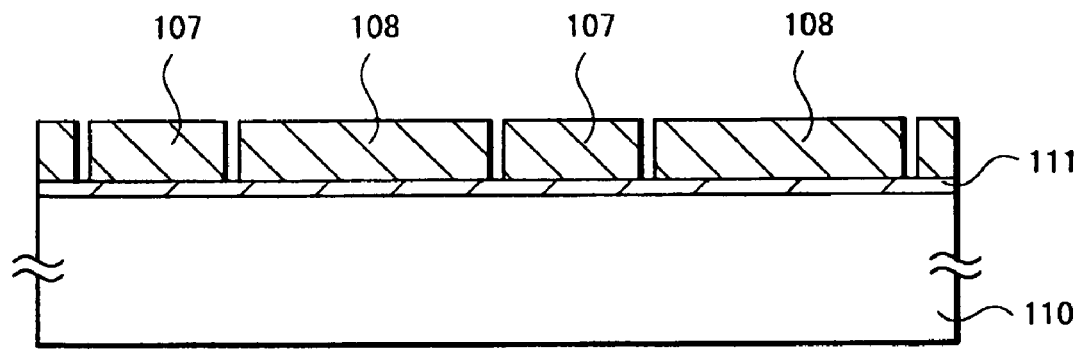
FIG. 2 is an enlarged cross-sectional view taken along the line A-A of the imaging device shown in FIG. 1.
Figure 6:
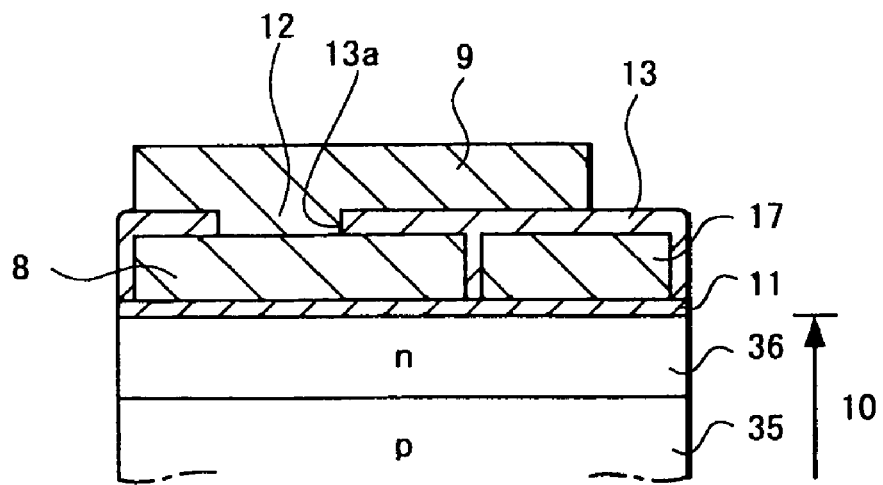
FIG. 6 is an enlarged cross-sectional view taken along the line A-A of the imaging device shown in FIG. 4.

FIG. 6 is an enlarged cross-sectional view taken along the line A-A of the imaging device shown in FIG. 2.

As shown in FIG. 6, the transfer electrodes 7 and 8 formed of polycrystalline silicon layers are formed on the silicon substrate 10 through the gate insulating film 11 made of a suitable material such as silicon oxide by a single layer structure. To be more in detail, the shunt wiring 9 is located above the transfer electrode 7 and the transfer electrode 8 serving as the read electrode as well through the interlayer insulator 13 made of a suitable material such as silicon oxide. The contact-hole 13a is formed on the transfer electrode 8 by removing a part of the interlayer insulator 13. The shunt wiring 9 is connected through this contact-hole 13a to the transfer electrode 8 serving as the read electrode as well. The transfer electrodes 7 and 8 may be formed by a multilayer structure such that the end portions thereof may partly overlap with each other.

Figure 7:
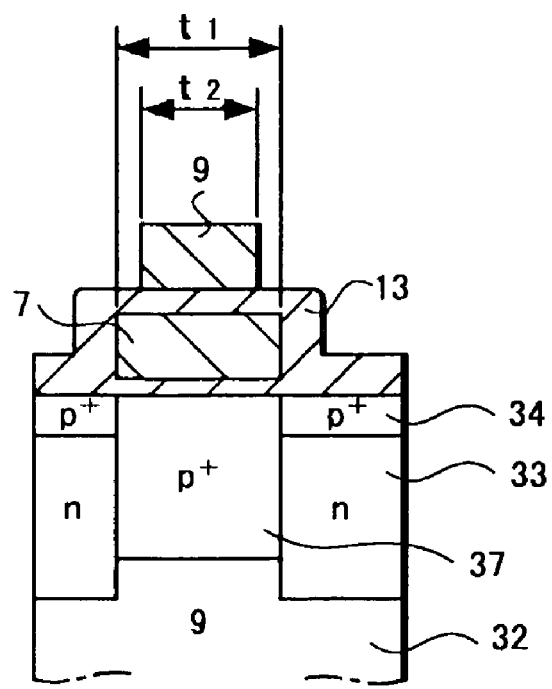
FIG. 7 is an enlarged cross-sectional view taken along the line B-B of the imaging device shown in FIG. 4.

FIG. 7 is an enlarged cross-sectional view taken along the B-B of the imaging device shown in FIG. 4. In FIG. 7, elements and parts identical to those of FIGS. 4 to 6 are denoted by identical reference numerals.

Specifically, as shown in FIG. 7, the transfer electrode 7, formed of the polycrystalline silicon layer, is formed on the silicon substrate 10 through the gate insulating film 11 made of a suitable material such as silicon oxide and on which the shunt wiring 9 is formed through the interlayer insulator 13. As shown in FIG. 7, the vertical width t2 of the shunt wiring 9 is made narrower than the vertical width t1 of the transfer electrode 7.

According to the CCD imaging device 1 of the above-mentioned first embodiment, since the transfer electrode 8 serving as the read electrode as well is not located between the light-receiving portions (pixels) 2 and 2 which are adjoining each other in the vertical direction, the p⁺ channel stop layer 37 corresponding to the spacing between the light-receiving portions 2 and 2 which are adjoining each other in the vertical direction can be prevented from being applied with the read voltage and hence the potential barrier of the p⁺ channel stop layer 37 can be prevented from being modulated. Specifically, when the read voltage V1 is applied to the transfer electrode 8, it is possible to prevent color mixture from occurring between the light-receiving portions 2 and 2 which are adjoining each other in the vertical direction. Also, it is possible to apply the read voltage V1 to the transfer electrode 8 serving as the read electrode as well with high reliability by using the shunt wiring 9. Further, since the shunt wiring 9 is provided on the transfer electrode 7, the read voltage V1 applied to the shunt wiring 9 can be prevented from affecting the p⁺ channel stop layer 37 located beneath the transfer electrode 7 so that the potential barrier of the p⁺ channel stop layer 37 can be prevented from being modulated. Also, since the width t2 of the shunt wiring 9 between the light-receiving portions 2 and 2 is made narrower than the width t1 of the transfer electrode 7 and the width w3 of the shunt wiring 9 within the vertical transfer register 3 is made narrower than the width w2 of the transfer electrode 8, when incident light is received by the light-receiving portions 2 and 2, incident light can be prevented from being shaded by the shunt wiring 9 and hence efficiency at which incident light is focused on the light-receiving portions 2 and 2 can be improved. Further, when the p⁺ channel stop layer 37 is formed, the number of the ion implantation processes can be decreased. Also, since the impurity concentration of the p⁺ channel stop layer 37 can be suppressed, impurities of the p⁺ channel stop layer 37 can be suppressed from being diffused into the lateral direction in the activation annealing process after ions were implanted. Accordingly, the area of the regions of the light-receiving portion 2 can be enlarged and hence sensitivity of the imaging device 1 can be improved. In particular, when the transfer electrode is formed by the single layer structure, it is possible to prevent color mixture from occurring between the pixels which are adjoining each other in the vertical direction.

Figure 8:
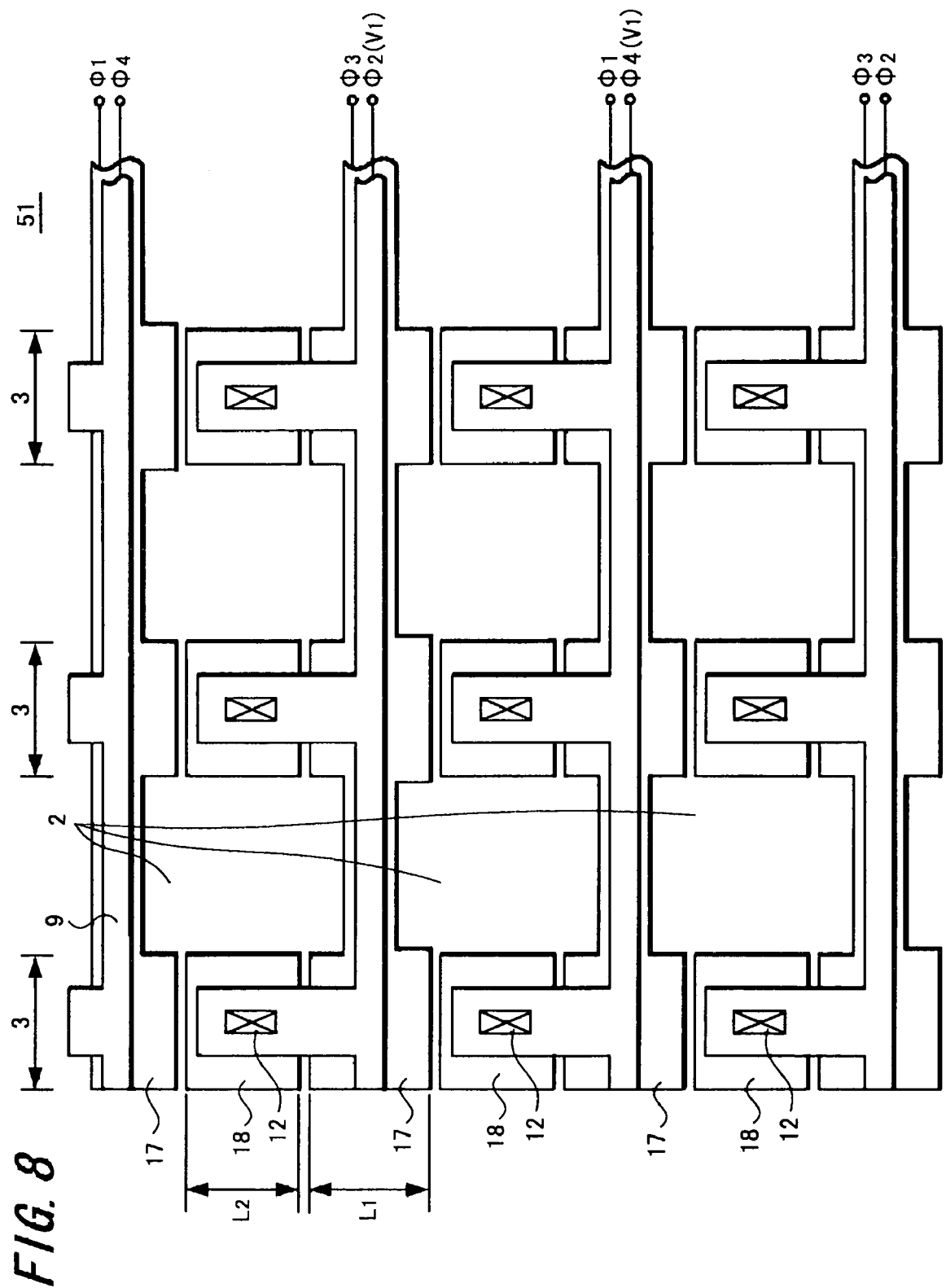
FIG. 8 is a plan view showing a main portion of an image pickup region of a imaging device having a transfer electrode according to a second embodiment of the present invention and an electrode pattern thereof.

FIG. 8 is a plan view showing a CCD imaging device 51 according to a second embodiment of the present invention. In the second embodiment, elements and parts identical to those of the first embodiment are marked with identical reference numerals and therefore need not be described. In the CCD imaging device 51 of this embodiment, as shown in FIG. 8, a vertical width of a transfer electrode 18 serving as a read electrode as well, that is, a width L2 of the charge transfer direction is formed to be the same as a vertical width L1 of a transfer electrode 17. An extended portion extending in the charge transfer direction is provided on the transfer electrode 17 provided within the vertical transfer register 3 and the length L1, which results from adding the vertical width of this extended portion to the vertical width of the transfer electrode 17 located between the light-receiving portions 2 and 2 which are adjoining each other in the vertical direction is formed to become the same as the vertical width L2 of the transfer electrode 18. The length of the above-described extended portion is selected in such a manner that the same lengths are extended from the center of the transfer electrode 18 in the upper and lower direction.

According to the CCD imaging device 51 of the second embodiment of the present invention, since the width L1 of the transfer electrode 17 and the vertical width L2 of the transfer electrode 18 are identical to each other within the vertical transfer register 3, transfer balance required when signal electric charges are transferred within the vertical transfer register 3 can be improved.

Also, since the central position of the transfer electrode 18 serving as the read electrode as well is formed so as to become coincident with the central position of the light-receiving portion 2, efficiency at which signal electric charges are read out from the light-receiving portion 2 can be improved. In addition, the CCD imaging device 51 according to the second embodiment can achieve effects similar to those of the first embodiment, such as to prevent color mixture, to reduce the number of the manufacturing processes and to increase the area of the region of the light-receiving portion 2.

Figure 9:
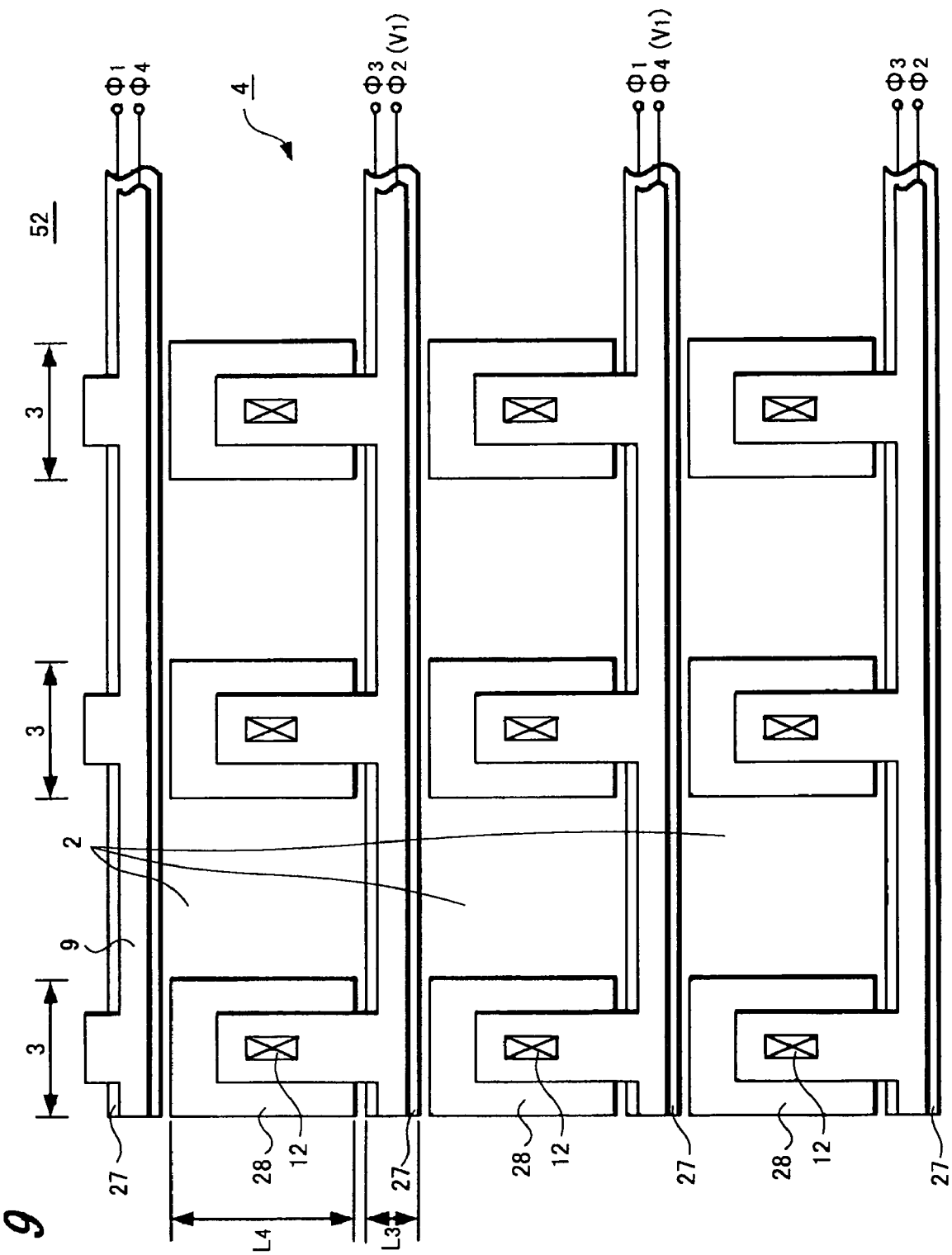
FIG. 9 is a plan view showing a main portion of an image pickup region of a imaging device having a transfer electrode according to a third embodiment of the present invention and an electrode pattern thereof.

FIG. 9 is a plan view showing a CCD imaging device 52 according to a third embodiment of the present invention. In the third embodiment, elements and parts identical to those of the first embodiment are denoted by identical reference numerals and therefore need not be described. In the CCD imaging device 52 according to this embodiment, a transfer electrode 27 does not have an extended portion extending in the vertical direction and vertical widths L3 of the transfer electrodes 27 are all formed to be the same. As shown in FIG. 9, a vertical width of a transfer electrode 28 serving as the read electrode as well within the vertical transfer register 3, that is, a width L4 in the charge transfer direction is formed so as to become substantially the same as the gap between the transfer electrodes 27 which are adjoining each other in the vertical direction. In other words, the length L4 of the vertical width of the transfer electrode 27 is formed so as to become the same as the length of the region of the light-receiving portion 2.

According to the CCD imaging device 52 of the third embodiment of the present invention, since the vertical width of the transfer electrode 28 serving as the read electrode as well, that is, the length of the width L4 to the charge transfer direction is increased, the width required when the read voltage is applied to the transfer electrode 28 can be increased. In other words, signal electric charges can be read out from the light-receiving portion 2 with application of a low read voltage. Also, since the transfer electrode 27 does not include the extended portion extending in the vertical direction, the manufacturing process of the imaging device 52 can be facilitated. In addition, the CCD imaging device 52 according to the third embodiment of the present invention can achieve effects similar to those of the first embodiment, such as to prevent color mixture, to reduce the number of the manufacturing processes and to increase the area of the region of the light-receiving portion 2.

Figure 10:
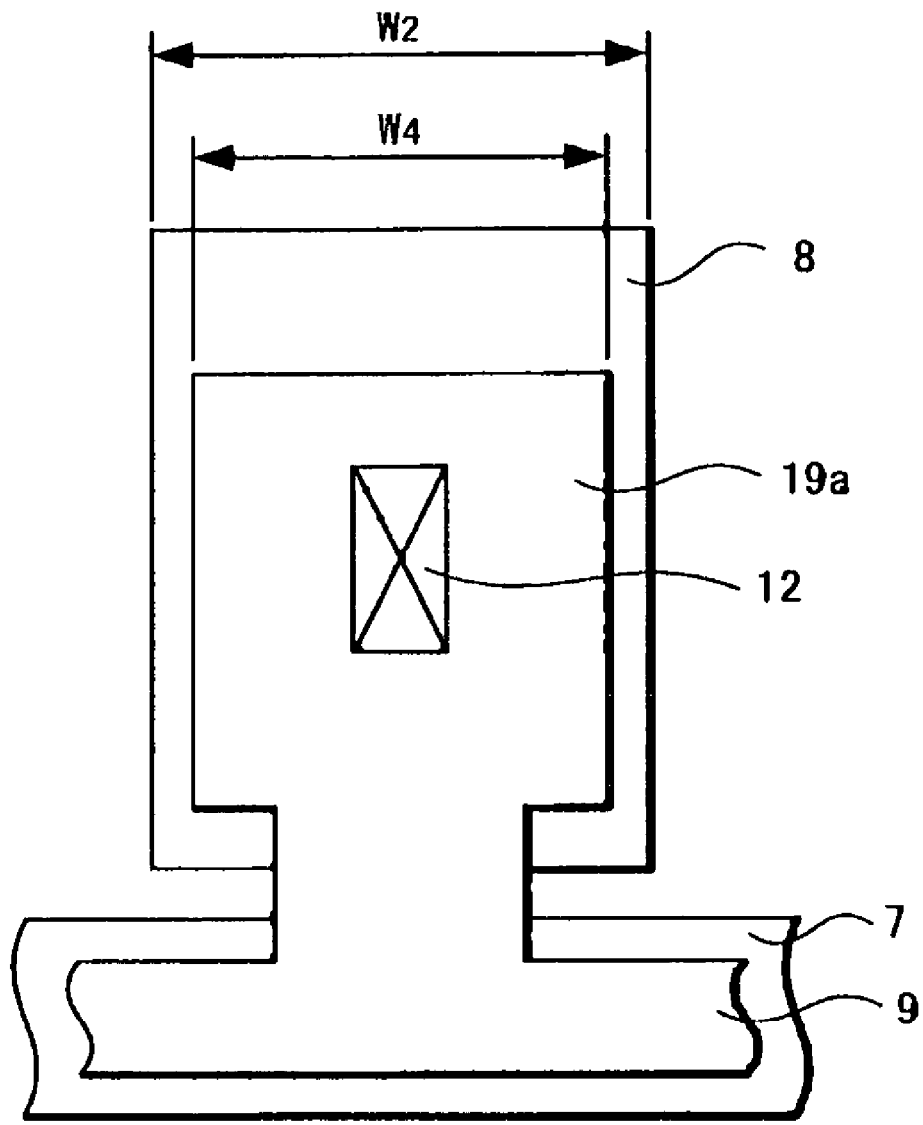
FIG. 10 is a schematic diagram showing another example of a shunt wiring formed on a transfer electrode which serves as a read electrode as well.

FIG. 10 is a schematic diagram showing another inventive example of the extended portion 9a of the shunt wiring 9 extended over the transfer electrode 8 serving as the read electrode as well. As shown in FIG. 10, an extended portion 19a is formed in such a manner that a horizontal width W4 of the extended portion 19a of the shunt wiring 9 may be increased. This width W4 is formed so as to become narrower than the horizontal width W2 of the transfer electrode 8. In consequence, since the area of the shunt wiring 9 on the transfer electrode 8 can be increased, a margin of a contact portion can be increased. That is, a processing work to form a contact portion on the transfer electrode 8 can be carried out easily.

While the present invention is applied to the interline transfer (IT) type CCD imaging device as described above, the present invention is not limited thereto and the present invention can be applied to other types of CCD imaging devices such as a frame interline transfer (FIT) type CCD imaging device or a camera module device including a CCD imaging device.

According to the imaging device of the present invention, color mixture can be prevented from occurring between the pixels which are adjoining each other in the vertical direction and hence resolution and spectral characteristics of the imaging device can be improved. Also, it is possible to decrease the additional process for forming a channel stop region between the pixels which are adjoining each other in the vertical direction.

When the transfer electrode serving as the read electrode as well is connected to the shunt wiring located between the light-receiving portions which are adjoining each other in the vertical direction, predetermined drive pulses can be applied to the transfer electrodes serving as the respective horizontal read electrodes as well at the same time.

When this shunt wiring is formed on other transfer electrode, it is possible to prevent the channel stop layer between the light-receiving portions, which are adjoining each other in the vertical direction, from being affected by the read voltage required when electric charges are read out from the light-receiving portions.

When the vertical width of the shunt wiring is formed to be narrower than the vertical width of the transfer electrode on which the shunt wiring is provided, when incident light is received by the light-receiving portions, incident light can be prevented from being shaded by the shunt wiring and hence focusing efficiency can be improved.

When the vertical width of the transfer electrode serving as the read electrode as well within the vertical transfer register is formed to be the same as the vertical width of other transfer electrode, it is possible to improve efficiency at which signal electric charges can be transferred within the vertical transfer register.

The present invention is particularly suitable for use as the application to the imaging device in which the transfer electrode serving as the read electrode as well and other transfer electrode are formed by a single layer structure.

It should be understood by those skilled in the art that various modifications, combinations, sub-combinations and alterations may occur depending on design requirements and other factors insofar as they are within the scope of the appended claims or the equivalents thereof.

What is claimed is:

1. An imaging device comprising:
an image pickup region comprised of a plurality of light-receiving portions, a plurality of vertical transfer channels arranged one per column of light receiving portions, and a plurality of transfer electrodes arranged over the vertical transfer channels and disposed periodically in the column direction for driving charges in the vertical direction through the vertical transfer channel,
wherein said plurality of transfer electrodes include a first and second electrode disposed for each row of light receiving portions, the first transfer electrode also serving as a read electrode for reading charges out of an adjacent respective light receiving portion and into the vertical transfer channel, wherein a shunt wiring is formed in each row for electrically connecting the first electrodes formed in each respective row to provide a signal to the first electrodes, wherein the shunt wiring extends across the row above a conductor for the second electrodes in a region between adjacent pixels without extending over any portion of the pixels;
wherein each shunt wiring has shunt protrusions that extend in the column direction from the shunt wiring, a contact being formed between the shunt protrusions and the respective first electrodes to electrically connect the shunt protrusions to the respective first electrodes;
wherein a width measured in the row direction of the shunt protrusion formed over the vertical transfer channel is less than a width measured in the row direction of the first electrode formed over the vertical transfer channel;
wherein each shunt protrusion has a first maximum width measured in the row direction in a region over the separation between the first transfer electrode and second transfer electrode, and a second maximum width measured in the row direction in a region over the first electrode, and wherein the first maximum width is less than the second maximum width.

* * * * *